United States Patent [19]
Casper

[11] Patent Number: 6,072,729
[45] Date of Patent: Jun. 6, 2000

[54] DATA-OUTPUT DRIVER CIRCUIT AND METHOD

[75] Inventor: Stephen L. Casper, Boise, Id.

[73] Assignee: Micron Technology, Inc., Boise, Id.

[21] Appl. No.: 09/138,861

[22] Filed: Aug. 24, 1998

[51] Int. Cl.[7] .................................................. G11C 7/00
[52] U.S. Cl. ...................... 365/189.05; 365/194; 326/83; 326/86; 327/108
[58] Field of Search .................................... 327/108, 109, 327/111, 112, 134, 170; 365/189.05, 194, 230.06, 189.11; 326/27, 17, 83, 86, 88, 121

[56] References Cited

U.S. PATENT DOCUMENTS

| | | | |
|---|---|---|---|
| 4,779,013 | 10/1988 | Tanaka | 326/27 |
| 5,670,894 | 9/1997 | Takaishi et al. | 326/27 |
| 5,805,505 | 9/1998 | Zheng et al. | 365/189.05 |
| 5,903,500 | 5/1999 | Tsang et al. | 365/189.05 |

*Primary Examiner*—David Nelms
*Assistant Examiner*—Gene N. Auduong
*Attorney, Agent, or Firm*—Dorsey & Whitney LLP

[57] ABSTRACT

A drive circuit includes drive input and output terminals, a supply terminal, a drive transistor, and a drive-control circuit. The drive transistor includes a control terminal, a first transistor terminal coupled to the drive output terminal, and a second transistor terminal coupled to the supply terminal. The drive-control circuit has an input terminal coupled to the drive input terminal and has an output terminal coupled to the control terminal of the drive transistor. The drive-control circuit generates on the control terminal of the drive transistor a signal level that changes at a first rate during a first time period and at a second higher rate during a second time period following the first time period. As a result, when used as a data-output driver, one can adjust the first and second rates and time periods such that the drive circuit meets both the 50-ohm and 50 pf falling-slew-rate ranges specified in the Intel® PC-100 specification.

49 Claims, 8 Drawing Sheets

DATA-OUTPUT DRIVER CIRCUIT AND METHOD

TECHNICAL FIELD

The invention relates generally to integrated circuits and, more particularly, to a data-output driver circuit having an improved slew-rate characteristic.

BACKGROUND OF THE INVENTION

Today's engineers often design electronic systems so that they will function properly when a component from one manufacturer is replaced with a like component from another manufacturer. For example, most personal computers will function properly with a Pentium® processor from Intel or a K6® processor from Advanced Micro Devices (AMD). This interchangeability of components provides many advantages. For example, because more than one manufacturer can source a particular component, competition among manufacturers is increased, thus lowering the cost per component. Furthermore, if one manufacturer runs out of a particular component, the system manufacturer can obtain like components from another manufacturer and thus avoid a production delay. Additionally, for systems such as personal computers, such interchangeability provides greater flexibility to a customer by allowing him to select components that meet his quality, performance, and cost expectations.

To allow component interchangeability, a system designer often specifies the operating characteristics and parameters that a component must meet in order to function in a particular system. Thus, if a manufacturer wants to design a component of the system, then it must design the component to meet these system specifications.

Table 1 at the end of the specification is a section of Intel's PC-100 specification for Synchronous Dynamic Random Access Memories (SDRAMs) designed for use on Intel's computer boards. Specifically, this section specifies the acceptable ranges of the rise- and fall-time slew rates (Volts/nanosecond) into 50-ohm and 50 picofarad (pf) loads, respectively, and the push (switching current high) and pull (switching current low) drive currents for an SDRAM's data output drivers. These drivers, which are called DQ drivers, are the circuits that drive the data onto the data bus during a read cycle. Unfortunately, conventional DQ drivers often cannot meet all the requirements of the PC-100 specification.

FIG. 1 is a schematic diagram of a conventional DQ driver 10, which drives a data output terminal 11 of an SDRAM. During a read cycle, the driver 10 receives a DATA IN signal from a selected memory cell (not shown) on an input terminal 12, and receives its complement $\overline{\text{DATA IN}}$ on an input terminal 13. Thus, when $\overline{\text{DATA IN}}$ is logic 1, DATA IN is logic 0, and vice versa. A conventional voltage-boost circuit 14 controls an NMOS pull-up transistor 16 in response to $\overline{\text{DATA IN}}$. The circuit 14 receives a boost voltage $V_{BOOST}$, which is typically at least one threshold voltage of the transistor 16 above $V_{DD}$. When $\overline{\text{DATA IN}}$ is logic 1, the circuit 14 applies $V_{BOOST}$ to the gate of the transistor 16, thus overdriving the transistor 16 so that it fully couples $V_{DD}$ to the output terminal 11. A conventional inverter 18, which includes a PMOS transistor 20 and an NMOS transistor 22, controls an NMOS pull-down transistor 24 in response to $\overline{\text{DATA IN}}$. When $\overline{\text{DATA IN}}$ is logic 1, the transistor 22 deactivates the transistor 24 by pulling its gate to $V_{SS}$, which is typically ground. Conversely, when $\overline{\text{DATA IN}}$ is logic 0, the transistor 20 activates the transistor 24 by pulling its gate to $V_{DD}$. Because the transistor 24 often has a relatively high input capacitance, the channel-width/channel-length ratio, and thus the gain, of the transistor 20 is made relatively high. This allows the transistor 20 to source the relatively large activation current required to quickly charge the input capacitance and thus quickly turn on the transistor 24.

Unfortunately, although the DQ driver 10 meets most of the PC-100 specifications in Table 1, it may not meet all of them. In operation, the boost circuit 14 controls the pull-up transistor 16 such that the driver 10 does generate the rising slew rates within the specified ranges when a 50-ohm load and a 50 pf load are respectively connected between the output terminal 11 and $V_{SS}$. The driver 10 also meets the push drive-current specification, which means that the transistor 16 sources current within the specified range when the output terminal 11 is at 1.65 V. But unfortunately, although the transistor 20 drives the transistor 24 such that driver 10 meets the pull drive-current specification, the driver 10 may not meet one of the 50-ohm and 50 pf falling slew-rate specifications as discussed below.

An embodiment of the driver 10 that meets one but misses the other falling slew-rate specification will now be discussed with reference to FIGS. 2 and 3 and Table 1. FIG. 2 is a graph showing the falling slew rate into a 50 pf load for the driver 10. Here, the gain of the transistor 20 is such that the transistor 24 generates a 50 pf falling slew rate of approximately 3.5 V/nS within the specified region 26 of between 1.2 and 1.8 V. Referring to Table 1, this 50 pf falling slew rate is within the specified range of 1.3–3.6 V/ns. FIG. 3 is a graph of the falling slew rate into a 50-ohm load for the same embodiment of the driver 10. Here, the gain of the transistor 20 is such that the transistor 24 generates a 50-ohm falling slew rate of approximately 16 V/nS within the specified region 26. Referring to Table 1, however, this 50-ohm falling slew rate is well above the maximum specified slew rate of 5 V/nS.

The problem with this embodiment of the driver 10 is that the gain of the transistor 20, which is set high enough for the driver 10 to meet the 50 pf falling slew-rate specification, causes the driver 10 to exceed the 50-ohm falling slew-rate specification. Unfortunately, reducing the gain of the transistor 20 so that the driver 10 meets the 50-ohm falling slew-rate specification causes the driver 10 to undershoot the 50 pf falling slew-rate specification.

SUMMARY OF THE INVENTION

In one aspect of the invention, a drive circuit includes drive input and output terminals, a supply terminal, a drive transistor, and a drive-control circuit. The drive transistor includes a control terminal, a first transistor terminal coupled to the drive output terminal, and a second transistor terminal coupled to the supply terminal. The drive-control circuit has an input terminal coupled to the drive input terminal and has an output terminal coupled to the control terminal of the drive transistor. The drive-control circuit generates on the control terminal of the drive transistor a signal level that changes at a first rate during a first time period and changes at a second, higher rate during a second time period following the first time period.

One can adjust the first and second rates and the first and second time periods such that the drive circuit meets both the 50-ohm and 50 pf falling slew rates specified in the PC-100 specification.

DETAILED DESCRIPTION OF THE INVENTION

Figure 1:
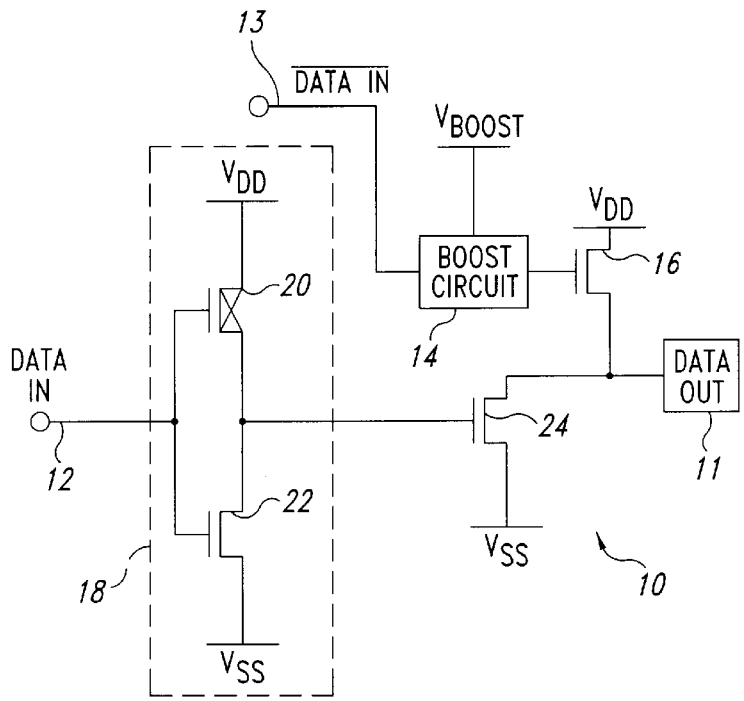
FIG. 1 is a schematic diagram of a conventional data-output drive circuit.
Figure 4:
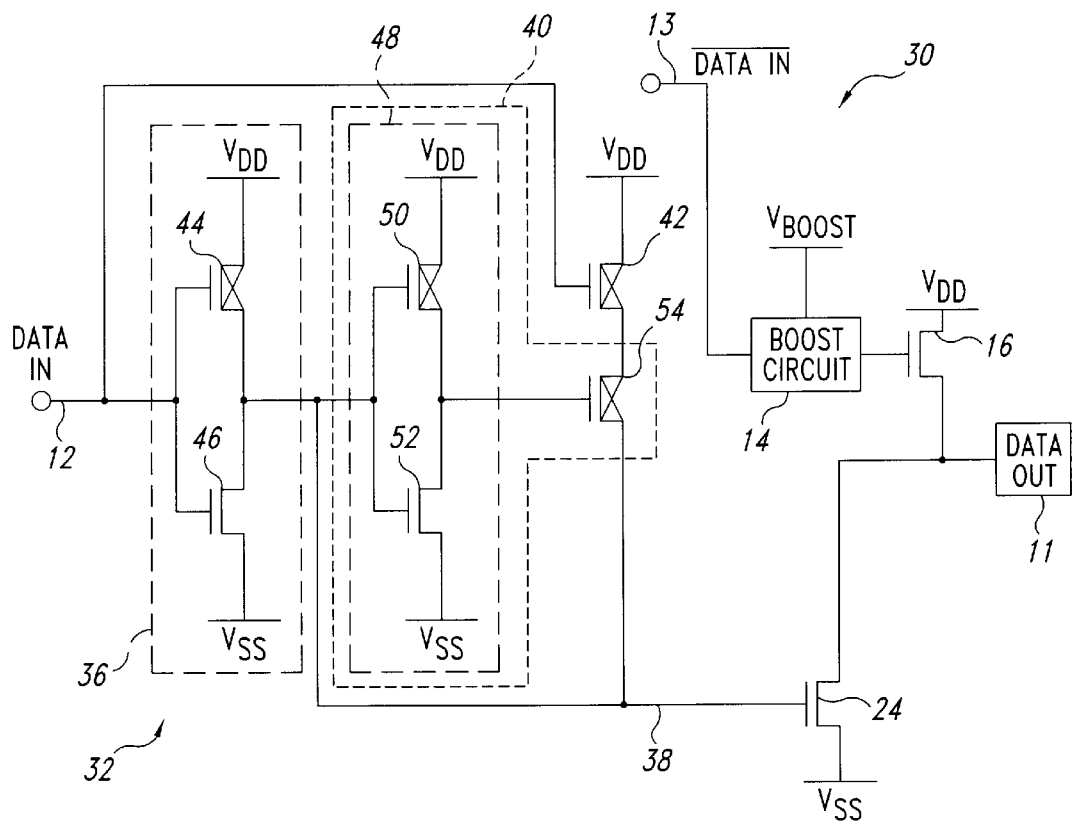
FIG. 4 is a schematic diagram of a data-output drive circuit according to an embodiment of the invention.
Figure 2:
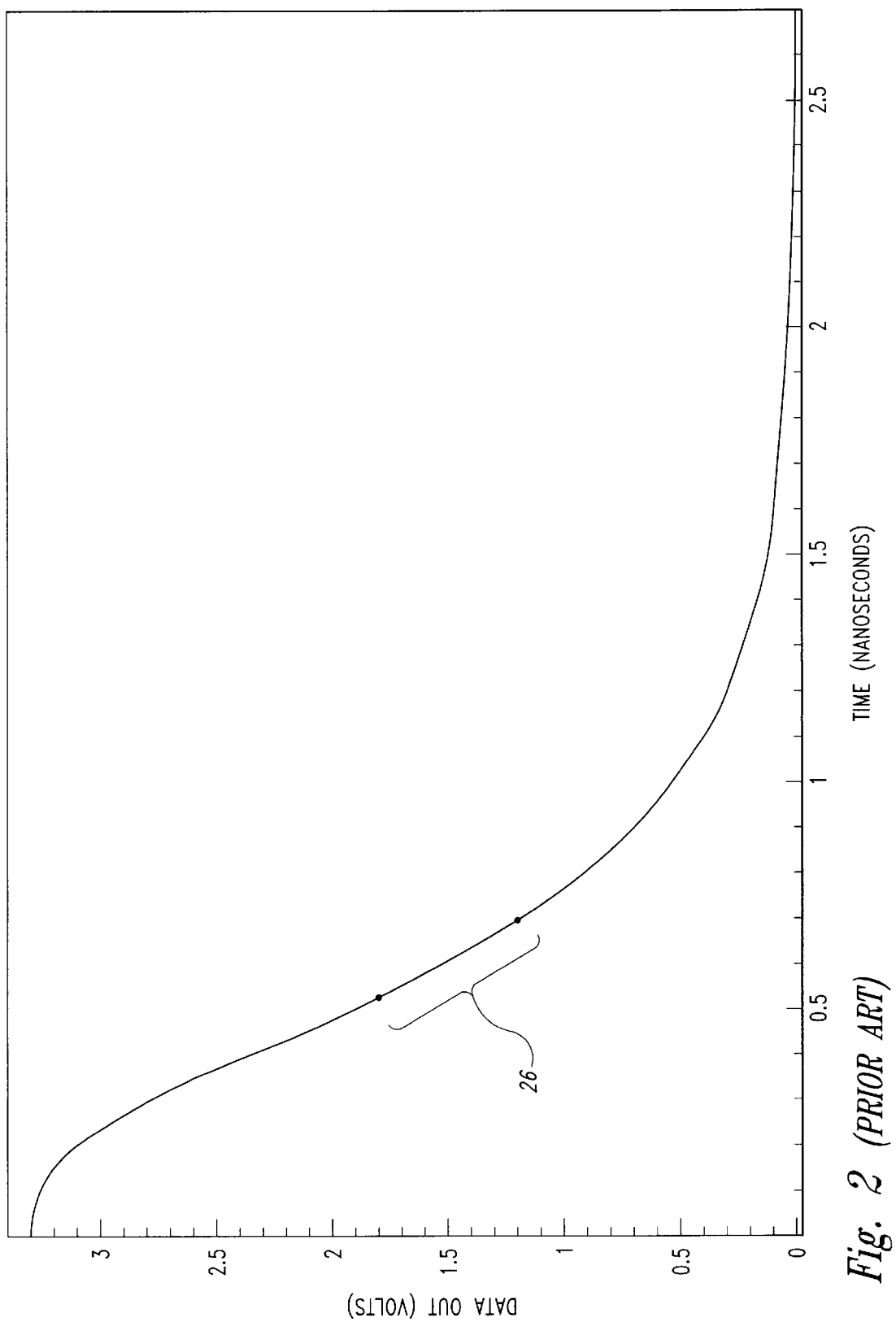
FIG. 2 is a graph showing the 50 pf falling slew rate of the drive circuit of FIG. 1.
Figure 3:
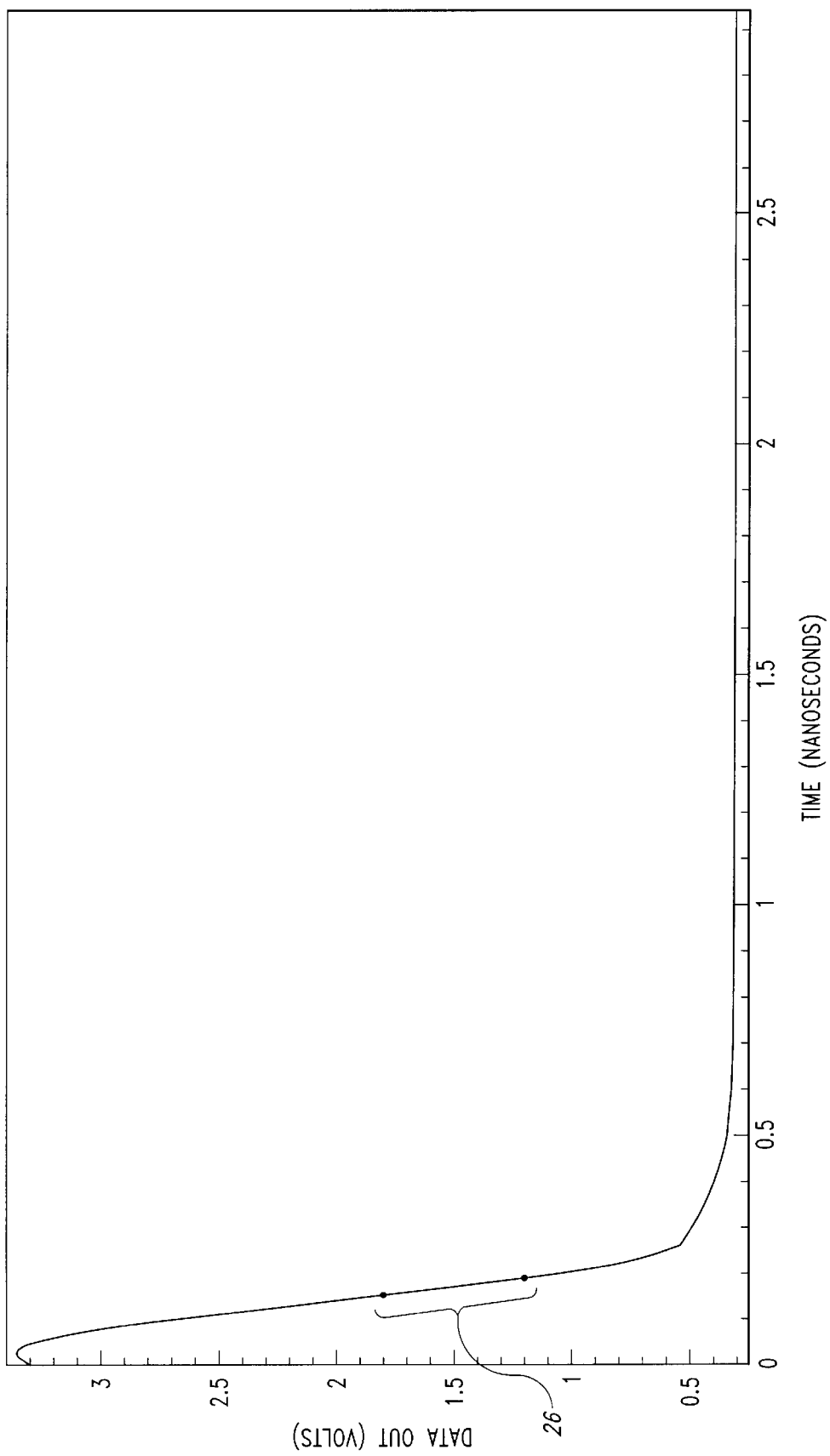
FIG. 3 is a graph showing the 50-ohm falling slew rate of the drive circuit of FIG. 1.

FIG. 4 is a schematic diagram of a DQ drive circuit 30 according to an embodiment of the invention, with like numerals representing like components of the drive circuit 10 of FIG. 1. The drive circuit 30 includes the boost circuit 14, pull-up transistor 16, and pull-down transistor 24, which are constructed and which operate similarly to the same components of the drive circuit 10. But unlike the drive circuit 10, the drive circuit 30 also includes a drive-control circuit 32, which drives the transistor 24. Generally, the circuit 32 generates a multi-slope control signal that allows the transistor 24 to generate 50-ohm and 50 pf falling slew rates that meet the PC-100 specification.

More specifically, the drive-control circuit 32 includes a first drive-control stage 36, which during a first time period generates a first portion of the control signal having a first slope characteristic on the gate of the transistor 24 via a line 38. The circuit 32 also includes a second drive-control stage 40, which generates a second portion of the control signal having a second slope characteristic on the line 38 during a second time period that follows the first time period. Additionally, a switch 42 may be included to cut off power to a portion of the second stage 40 when the input data signal transitions to logic 1. This significantly speeds up the turn-off time of the second stage 40. In one embodiment, the switch 42 is a PMOS transistor.

In one embodiment, the first stage 36 is an inverter that includes a PMOS pull-up transistor 44 and an NMOS pull-down transistor 46. The transistor 44 is sized such that during the first time period when DATA IN is logic 0, the transistor 44 causes a control voltage on the line 38 to rise according to a first rate characteristic. The second stage 40 includes a second inverter 48, which includes a PMOS pull-up transistor 50 and an NMOS pull-down transistor 52, and a PMOS transistor 54 having its gate coupled to the output of the inverter 48. During the second time period when DATA IN is logic 0, the inverter 48 controls the transistor 54 such that it causes the control voltage on the line 38 to rise according to a second rate characteristic, which in one embodiment is steeper than the first rate characteristic. As stated above, by properly adjusting the first and second rate characteristics during the respective first and second time periods, the drive-control circuit 32 controls the transistor 24 such that the drive circuit 30 meets the PC-100 50 pf and 50-ohm falling slew-rate specifica-
tions. For example, in one embodiment as discussed below, setting the gain of the transistor 54 to be two or more times the gain of the transistor 44 allows the drive circuit 30 to meet all of the PC-100 specifications.

In operation, referring to FIG. 4, when DATA IN is logic 1, the transistor 46 deactivates the transistor 24 by pulling its gate to $V_{SS}$, which is ground in this embodiment. The logic 1 DATA IN also deactivates the switch 42, which cuts off power to the transistor 54. The transistor 46 pulls the input of the inverter 48 to ground, thus activating the transistor 50 and deactivating the transistor 52. The active transistor 50 deactivates the transistor 54 by pulling its gate to $V_{DD}$. Therefore, whether or not the drive circuit 30 includes the switch 42, the transistor 54 is disabled from driving a signal onto the line 38. Furthermore, as discussed in conjunction with FIG. 1, when $\overline{\text{DATA IN}}$ is logic 1 the boost circuit 14 activates the pull-up transistor 16 such that the DQ circuit 30 meets the rising slew-rate and push drive-current requirements of the PC-100 specification of Table 1.

Figure 5:
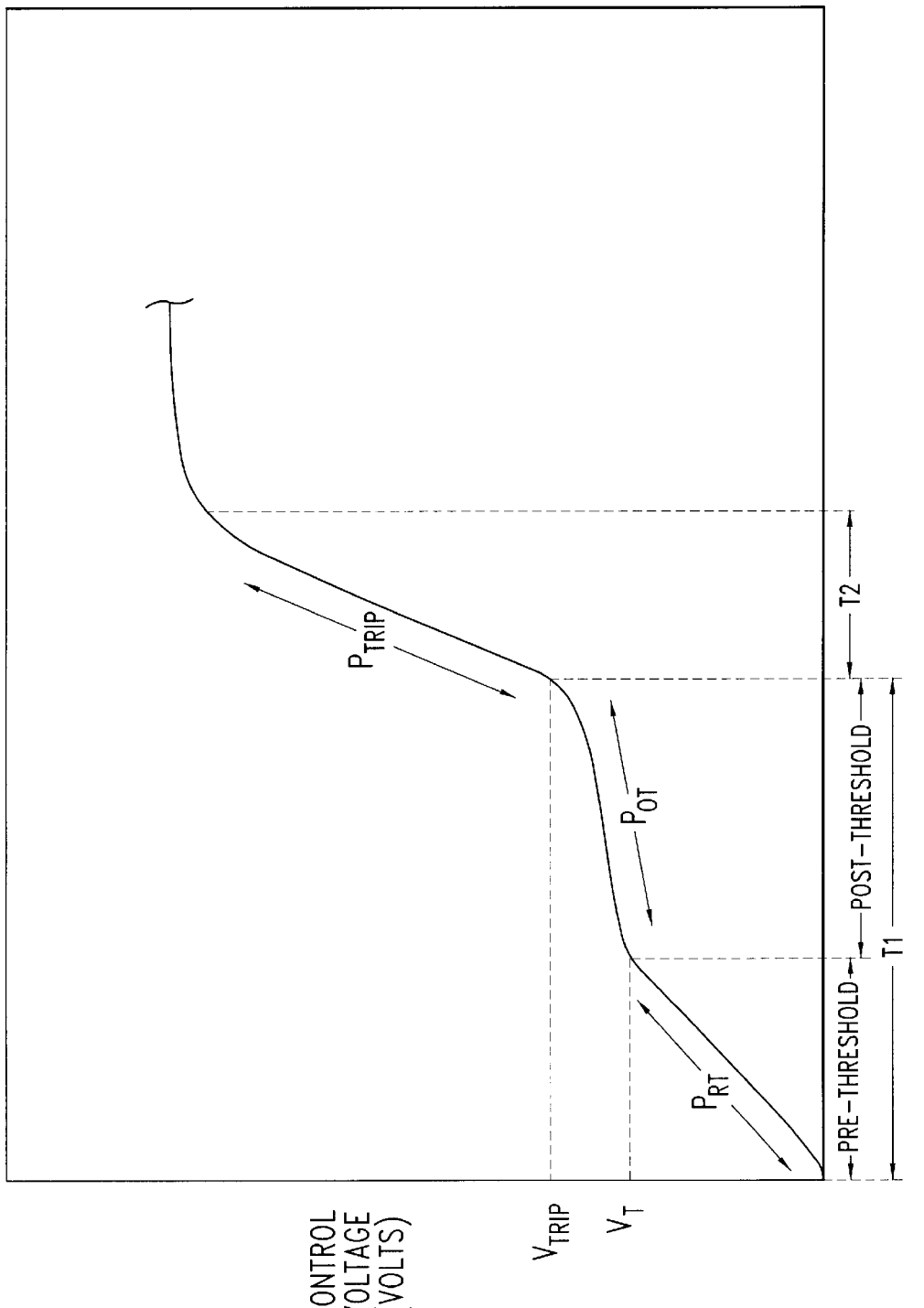
FIG. 5 is a graph showing a drive-transistor control signal generated by the drive-control circuit of FIG. 4.

Referring to FIGS. 4 and 5, when DATA IN is logic 0, the transistor 44 becomes active and starts pulling up the control voltage (from ground) on the line 38 at a pre-threshold rate $P_{RT}$ during a pre-threshold portion of a first time period T1. When the control voltage becomes equal to the threshold voltage $V_T$ of the transistor 24, the channel of the transistor 24 begins to conduct, and thus significantly increases the input capacitance at the gate of the transistor 24. Because it can source only a finite amount of current to charge this increased capacitance, the transistor 44 pulls up the control voltage at a significantly lower post-threshold rate $P_{OT}$ during a post-threshold portion of T1. $P_{RT}$ and $P_{OT}$ together compose the first rate characteristic of the control voltage during T1. Although in this embodiment $P_{RT}$ is significantly greater than $P_{OT}$, in other embodiments the first stage 36 may be constructed so that $P_{RT}$ and $P_{OT}$ are more uniform.

Still referring to FIGS. 4 and 5, when the control voltage on the line 38 becomes equal to the trip point $V_{TRIP}$ of the inverter 48, the transistor 52 begins pulling the gate of the transistor 54 towards ground. (The trip point of the inverter 48 is the input voltage level that causes the transistor 52 to sink more current than the transistor 50 sources.) The threshold voltage of the transistor 54 is such that it begins turning on at this point. Once activated, the transistor 54 provides additional current to the charge the input capacitance of the transistor 24. Therefore, referring to FIG. 5, during a second time period T2, the control voltage increases at a post-trip-voltage rate $P_{TRIP}$ that is significantly greater than both $P_{RT}$ and $P_{OT}$.

It is noted that FIG. 5 is not drawn to scale, but merely illustrates the different portions of the control voltage and the relative differences between them for some embodiments of the invention. Furthermore, as discussed above, in one embodiment, to obtain the desired first and second rate characteristics, the gain of the transistor 54 is two or more times the gain of the transistor 44. Thus, because both the transistor 44 and the transistor 54 are PMOS transistors, the channel-width/channel-length ratio of the transistor 54 is at least twice that of the transistor 44 in such an embodiment. Additionally, although $P_{TRIP}$ is greater than both $P_{RT}$ and $P_{OT}$ in the described embodiment, in other embodiments $P_{TRIP}$ may be less than $P_{RT}$ but greater than $P_{OT}$. Moreover, although described as controlling the pull-down transistor 24, the drive-control circuit 32 can be modified to control the pull-up transistor 16 with a multi-sloped control signal.

Figure 6:
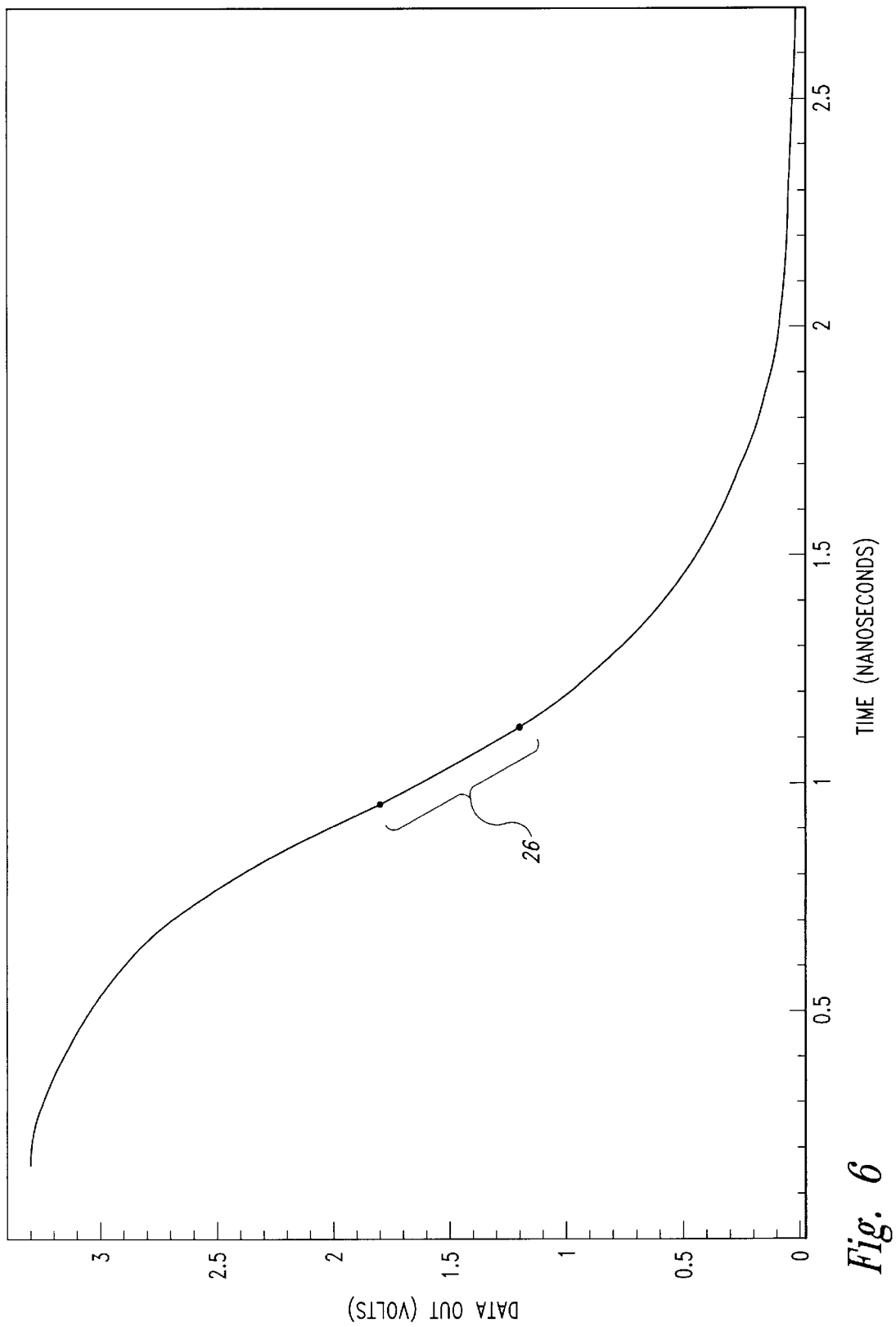
FIG. 6 is a graph showing the 50 pf falling slew rate of the drive circuit of FIG. 4.
Figure 7:
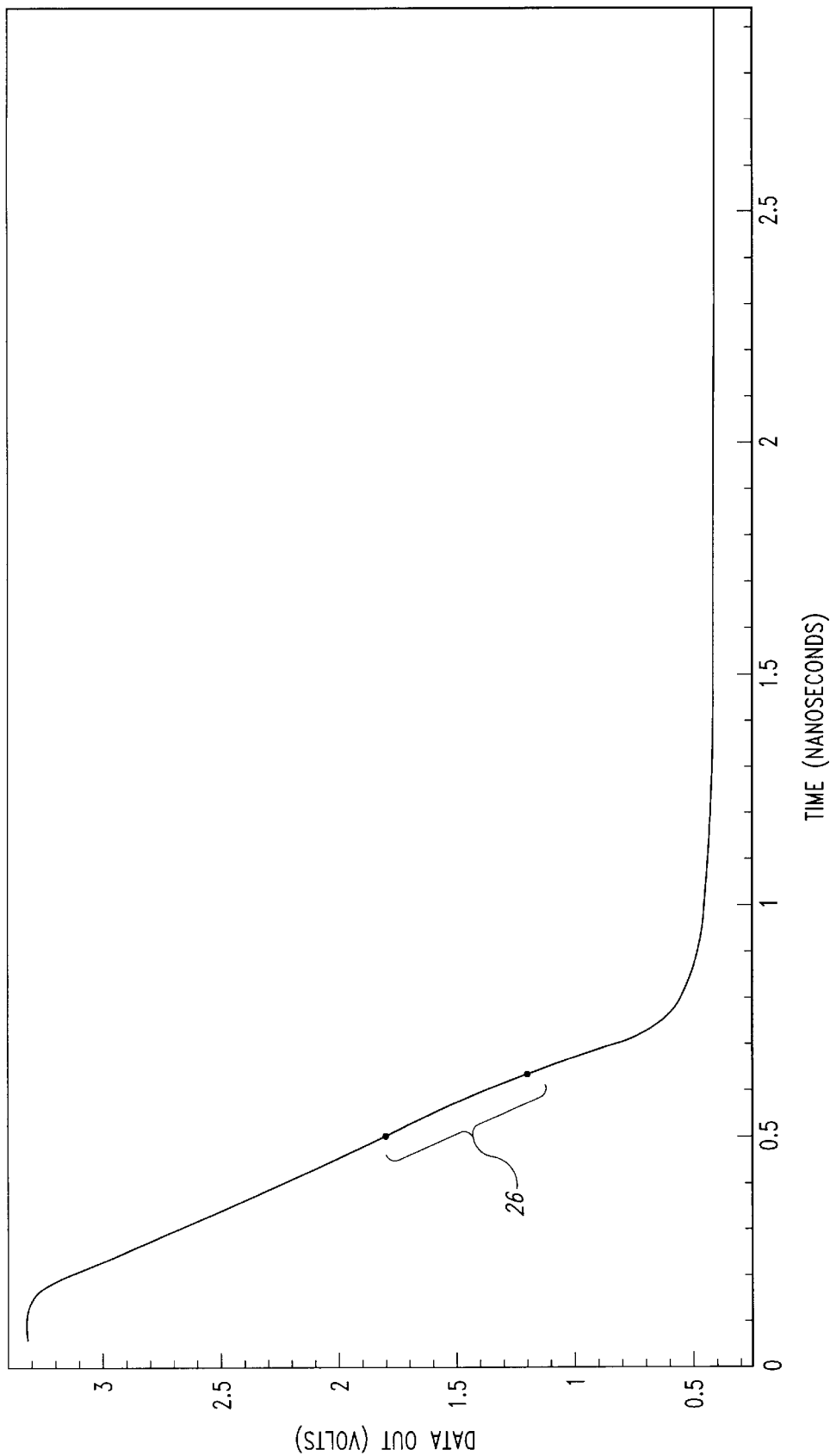
FIG. 7 is a graph showing the 50-ohm falling slew rate of the drive circuit of FIG. 4.

Referring to FIGS. 6 and 7, it is clear that for the embodiment of the DQ driver 30 described in conjunction with FIGS. 4 and 5, the drive-control circuit 32 controls the transistor 24 such that the drive circuit 30 meets both the 50-ohm and 50 pf falling slew-rate requirements of the PC-100 specification in Table 1. Referring to FIG. 6, the 50 pf falling slew rate is 3.4 V/nS within the linear region 26. This clearly is within the range 1.3–3.8 V/nS specified in the PC-100 specification. Likewise, referring to FIG. 7, for the same embodiment of the drive circuit 30, the 50-ohm falling slew rate is 4.8 V/nS within the region 26. This is clearly within the range of 2.0–5.0 V/nS specified in the PC-100 specification.

In light of the above description, the general theory of operation of the circuit 30 of FIG. 4 is as follows. Because a resistive load requires less switching current than a capacitive load, during the time period T1, the transistor 24 pulls the voltage at the output terminal 11 lower for a 50-ohm load than it does for a 50 pf load. Therefore, at the start of the time period T2, the voltage on the output terminal 11 is closer to 0 V for the 50-ohm load than it is for the 50 pf load. For the 50-ohm load, this output voltage is close enough to 0 V so that the increase in the 50-ohm falling slew rate caused by the increased transistor 24 switching current during T2 is limited by the output voltage approaching 0 V. Thus, the increased switching current does not cause the 50-ohm slew rate to exceed the maximum value specified in the PC-100 specification. Conversely, for the 50 pf load during T1, the output voltage on the terminal 11 is far enough from 0 V so that during T2, the transistor 24 has a greater voltage range over which to increase the 50 pf falling slew rate. Thus, the increased transistor 24 switching current is able to increase the 50 pf falling slew rate above the minimum value specified in the PC-100 specification. Therefore, one can vary $P_{RT}$, $P_{OT}$, $P_{TRIP}$, T1, or T2 accordingly such that the circuit 30 meets both the 50-ohm and 50 pf falling slew rates of the PC-100 specification.

The physical characteristics of the driver 30, such as the sizes of the transistors, may change depending upon the manufacturing process and the values of $V_{DD}$ and $V_{SS}$ to be used. However, one can vary $P_{RT}$, $P_{OT}$, $P_{TRIP}$, T1, and T2 by varying the gains of the transistors 44 and 54 and the trip point of the inverter 48 such that no matter what manufacturing process is used, the circuit 30 still fully meets the requirements of the PC-100 specification in Table 1.

Figure 8:
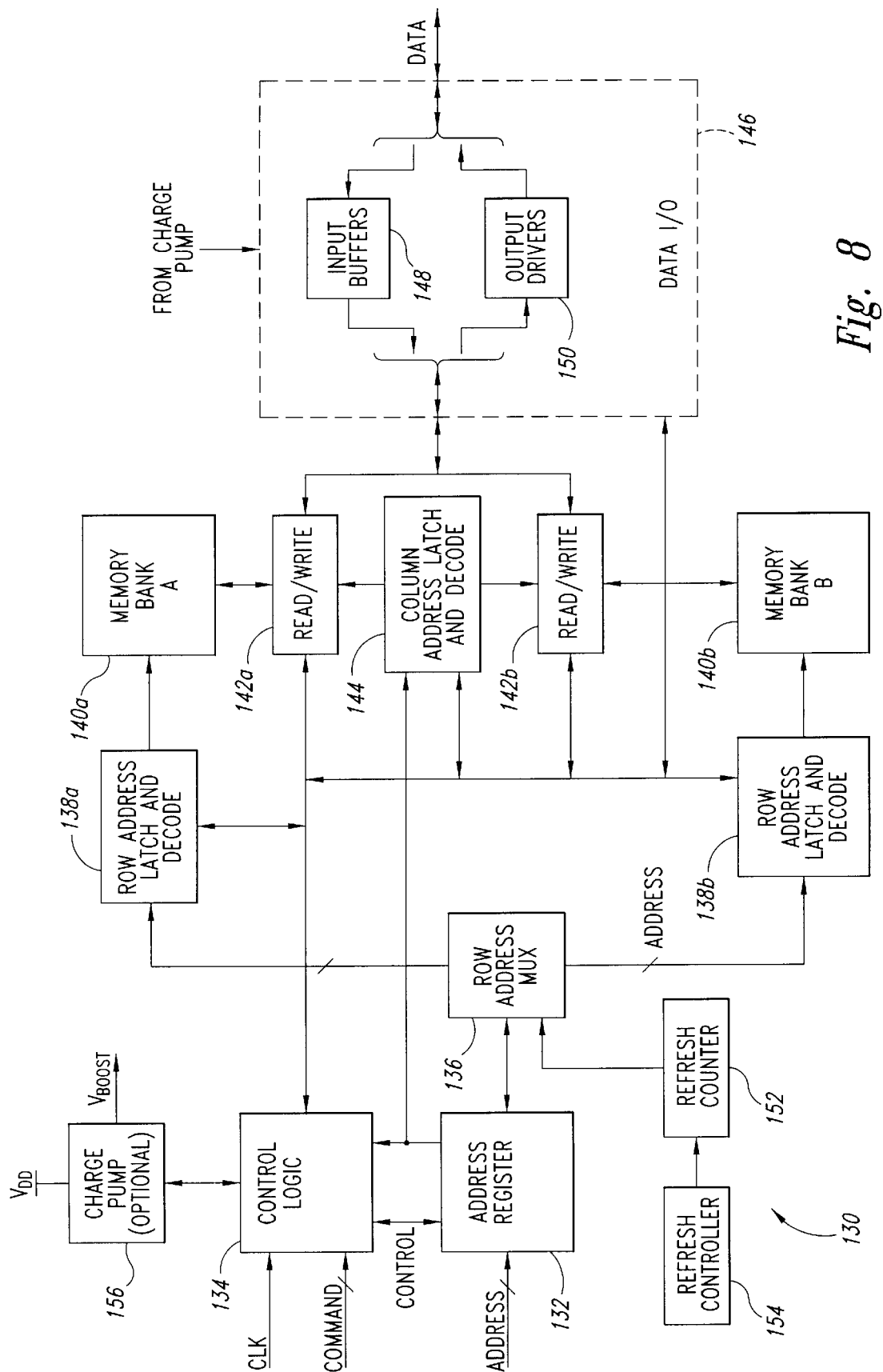
FIG. 8 is a schematic block diagram of an embodiment of a memory circuit that incorporates the drive circuit of FIG. 4.

FIG. 8 is a block diagram of one embodiment of a memory circuit 130, which includes the driver circuit 30 of FIG. 4. The memory circuit 130 includes an address register 132, which receives an address from an ADDRESS bus. A control logic circuit 134 receives a clock (CLK) signal, and receives a clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory circuit 130. A row address multiplexer 136 receives the address signal from the address register 132 and provides the row-address to the row-address latch-and-decode circuits 138a and 138b for the memory bank 140a or 140b, respectively. During read and write cycles, the row-address latch-and-decode circuits 138a and 138b activate the word lines of the addressed rows of memory cells in the memory banks 140a and 140b, respectively. Read/write circuits 142a and 142b read data from the addressed memory cells in the memory banks 140a and 140b, respectively, during a read cycle, and write data to the addressed memory cells during a write cycle. A column-address latch-and-decode circuit 144 receives the address from the address register 132 and provides the column address of the selected memory cells to the read/write circuits 142a and 142b. For clarity, the address register 132, the row-address multiplexer 136, the row-address latch-and-decode circuits 138a and 138b, and the column-address latch-and-decode circuit 144 can be collectively referred to as an address decoder.

A data input/output (I/O) circuit 146 includes a plurality of input buffers 148. During a write cycle, the buffers 148 receive and store data from the DATA bus, and the read/write circuits 142a and 142b provide the stored data to the memory banks 140a and 140b, respectively. The data I/O circuit 146 also includes a plurality of output drivers 150, typically one for each line of the DATA bus. These drivers 150 each include a drive circuit 30 of FIG. 4. During a read cycle, the read/write circuits 142a and 142b provide data from the memory banks 140a and 140b, respectively, to the drivers 150, which in turn provide this data to the DATA bus.

A refresh counter 152 stores the address of the row of memory cells to be refreshed either during a conventional auto-refresh mode or self-refresh mode. After the row is refreshed, a refresh controller 154 updates the address in the refresh counter 152, typically by either incrementing or decrementing the contents of the refresh counter 152 by one. Although shown separately, the refresh controller 154 may be part of the control logic 134 in other embodiments of the memory circuit 130.

The memory circuit 130 may also include an optional charge pump 156, which steps up the power-supply voltage $V_{DD}$ to the boost voltage $V_{BOOST}$, which is used by the boost circuit 14 of FIG. 4 to overdrive the transistor 16. In one embodiment, the pump 156 generates $V_{BOOST}$ approximately 1–1.5 V higher than $V_{DD}$. Furthermore, the memory circuit 130 may use $V_{BOOST}$ to conventionally overdrive selected internal transistors in addition to the transistor 16 of FIG. 4.

Figure 9:
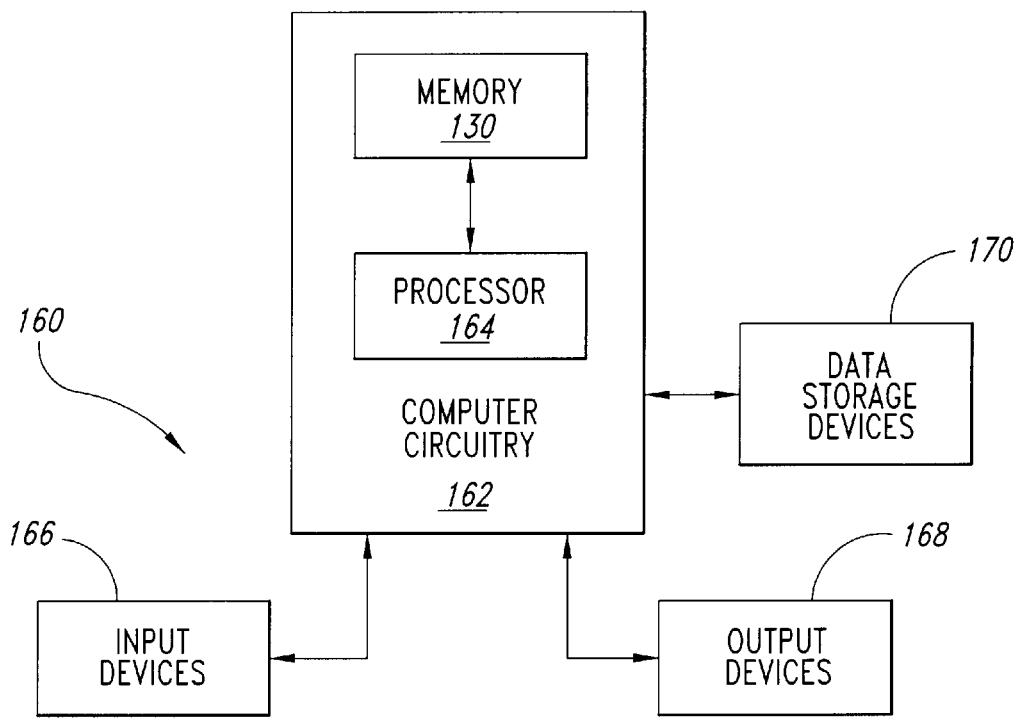
FIG. 9 is a schematic block diagram of an embodiment of an electronic system that incorporates the memory circuit of FIG. 8.

FIG. 9 is a block diagram of an electronic system 160, such as a computer system, that incorporates the memory circuit 130 of FIG. 8. The system 160 includes computer circuitry 162 for performing computer functions, such as executing software to perform desired calculations and tasks. The circuitry 162 typically includes a processor 164 and the memory circuit 130, which is coupled to the processor 164. One or more input circuits 166, such as a keyboard or a mouse, are coupled to the computer circuitry 162 and allow an operator (not shown) to manually input data thereto. One or more output circuits 168 are coupled to the computer circuitry 162 to provide to the operator data generated by the computer circuitry 162. Examples of such output circuits 168 include a printer and a video display unit. One or more data-storage circuits 170 are coupled to the computer circuitry 162 to store data on or retrieve data from external storage media (not shown). Examples of the storage circuits 170 and the corresponding storage media include drives that accept hard and floppy disks, tape cassettes, and compact disk read-only memories (CD-ROMs). Typically, the computer circuitry 162 includes address data and command buses and a clock line that are respectively coupled to the ADDRESS, DATA, and COMMAND buses, and the CLK line of the memory circuit 130.

From the foregoing it will be appreciated that, although specific embodiments of the invention have been described herein for purposes of illustration, various modifications may be made without deviating from the spirit and scope of the invention. Accordingly, the invention is not limited except as by the appended claims.

TABLE 1

PC-100 Specification
SDRAM DQ BUFFER OUTPUT DRIVE CHARACTERISTICS

| SYM | PARAMETER | CONDITION | MIN | TYP | MAX | UNIT | NOTE |
|---|---|---|---|---|---|---|---|
| $t_{rh}$ | Output Rise Time | measure in linear region: 1.2 V–1.6. V | 1.37 | | 4.37 | Volts/nS | 4 |
| $t_{fh}$ | Output Fall Time | measure in linear region: 1.2 V–1.6 V | 1.30 | | 3.6 | Volts/nS | 4 |
| $t_{rh}$ | Output Rise Time | measure in linear region: 1.2 V–1.6 V | 2.6 | 3.9 | 5.6 | Volts/nS | 1, 2, 3 |
| $t_{fh}$ | Output Fall Time | measure in linear region: 1.2 V–1.6 V | 2.0 | 2.9 | 5.0 | Volts/nS | 1, 2, 3 |
| $I_{ol}$ (AC) | Switching Current Low | Vout = 1.65 V | 75.4 | | — | mA | |
| | (Test Point) | Vout = 1.65 V | — | | 202.5 | mA | |
| $I_{oh}$ (AC) | Switching Current High | Vout = 1.65 V | −73.0 | | — | mA | |
| | (Test Point) | Vout = 1.65 V | — | | −248.0 | mA | |

NOTES:
1. Output rise and fall time must be guaranteed across $V_{DD}$, process and temperature range.
2. rise time specification based on 0 pf plus 50 ohms to $V_{SS}$, use these values to design to.
3. Fall time specification based on 0 pf plus 50 ohms to $V_{DD}$, use these values to design to.
4. Measured into 50 pf only, use these values to characterize to.
5. All measurements done with respect to $V_{SS}$.

What is claimed is:

1. A drive circuit, comprising:

drive input and output terminals;

first and second supply terminals;

a drive transistor having a control terminal, a first transistor terminal coupled to the drive output terminal, and a second transistor terminal coupled to the supply terminal; and a drive-control circuit having first and second inverters, and a second transistor, the first inverter having inverter input and output terminals respectively coupled to the drive input terminal and the control terminal of the drive transistor, the first inverter including a first transistor having a control terminal coupled to the inverter input terminal, a first transistor terminal coupled to the second supply terminal, and a second transistor terminal coupled to the inverter output terminal, the second inverter having an inverter input terminal coupled to the inverter output terminal of the first inverter and having an output terminal, and the second transistor having a control terminal coupled to the inverter output terminal of the second inverter, a first transistor terminal coupled to the second supply terminal, and a second transistor terminal coupled to the control terminal of the drive transistor, the drive-control circuit operable to generate a signal level on the control terminal of the drive transistor, the signal level changing at a first rate during a first time period and changing at a second rate during a second time period following the first time period, the second rate being greater than the first rate.

2. The drive circuit of claim 1 wherein:

the drive transistor has a threshold voltage;

the signal level comprises a voltage level; and the drive-control circuit is operable to generate the voltage level such that during the first time period, the voltage level changes at the first rate when the voltage level is less than the threshold voltage and changes at a post-threshold rate when the voltage level is equal to or greater than the threshold voltage, the first rate being greater than the post-threshold rate.

3. The drive circuit of claim 1 wherein:

the drive transistor has a threshold voltage;

the signal level comprises a voltage level; and the drive-control circuit is operable to generate the voltage level such that during the first time period, the voltage level changes at a pre-threshold rate when the voltage level is less than the threshold voltage and changes at the first rate when the voltage level is equal to or greater than the threshold voltage, the first rate being less than the pre-threshold rate.

4. The drive circuit of claim 1 wherein the signal level comprises an increasing voltage level.

5. The drive circuit of claim 1 wherein the first transistor has a first gain, and the second transistor has a second gain that is greater than the first gain of the first transistor.

6. The drive circuit of claim 1
wherein the second inverter has an activation level, and the second time period begins when the signal level is equal to or greater than the activation level of the second inverter.

7. A drive circuit, comprising:

drive input and output terminals;

first and second supply terminals;

a drive transistor having a control terminal, a first transistor terminal coupled to the drive output terminal, and a second transistor terminal coupled to the supply terminal;

a first drive-control stage having an input terminal coupled to the drive input terminal and having an output terminal coupled to the control terminal of the drive transistor, the first drive-control stage operable to cause a signal level on the control terminal of the drive transistor to change at a first rate; and a second drive-control stage having an activation level and a second inverter having an inverter input terminal coupled to the output terminal of the first drive-control stage and having an output terminal, the second drive-control stage further having a second transistor having a control terminal coupled to the inverter output terminal of the second inverter, a first transistor terminal coupled to the second supply terminal, and a second transistor terminal coupled to the control terminal of the drive transistor, the second drive-control stage operable to cause the signal level to change at a second rate that is greater than the first rate when the signal level is equal to or greater than the activation level.

8. The drive circuit of claim 7 wherein:

the drive transistor has a threshold voltage;

the signal level comprises a voltage level; and the first drive-control stage is operable to generate the voltage level such that during the first time period, the voltage level changes at the first rate when the voltage level is less than the threshold voltage and changes at a post-threshold rate when the voltage level is equal to or greater than the threshold voltage, the first rate being greater than the post-threshold rate.

9. The drive circuit of claim 7 wherein:

the drive transistor has a threshold voltage;

the signal level comprises a voltage level; and the first drive-control stage is operable to generate the voltage level such that during the first time period, the voltage level changes at a pre-threshold rate when the voltage level is less than the threshold voltage and changes at the first rate when the voltage level is equal to or greater than the threshold voltage, the pre-threshold rate being greater than the first rate.

10. The drive circuit of claim 7 wherein the signal level comprises an increasing voltage level.

11. The drive circuit of claim 7 wherein the first drive-control stage comprises a first inverter having inverter input and output terminals respectively coupled to the input and output terminals of the first drive-control stage, the first inverter including a first transistor having a control terminal coupled to the inverter input terminal, a first transistor terminal coupled to the second supply terminal, and a second transistor terminal coupled to the inverter output terminal, the first transistor having a first gain and the second transistor of the second drive-control stage having a second gain that is greater than the first gain of the first transistor.

12. A drive circuit, comprising:

drive input and output terminals;

first and second supply terminals;

a drive transistor having a control terminal, a first transistor terminal coupled to the drive output terminal, and a second transistor terminal coupled to the supply terminal;

a first drive-control stage having an input terminal coupled to the drive input terminal and having an output terminal coupled to the control terminal of the drive transistor, the first drive-control stage operable to generate on the control terminal of the drive transistor a first signal level that changes at a first rate; and a second drive-control stage having an activation level and a second inverter having an inverter input terminal coupled to the output terminal of the first drive-control stage and having an output terminal, the second drive-control stage further having a second transistor having a control terminal coupled to the inverter output terminal of the second inverter, a first transistor terminal coupled to the second supply terminal, and a second transistor terminal coupled to the control terminal of the drive transistor, the second drive-control stage operable to generate on the control terminal of the drive transistor a second signal level when a total signal level on the control terminal of the drive transistor is equal to or greater than the activation level, the total signal level being equal to a sum of the first and second signal levels and changing at a total rate that is greater than the first rate.

13. The drive circuit of claim 12 wherein:

the drive transistor has a threshold voltage;

the first signal level comprises a voltage level; and the first drive-control stage is operable to generate the voltage level such that during the first time period, the voltage level changes at the first rate when the voltage level is less than the threshold voltage and changes at a post-threshold rate when the voltage level is equal to or greater than the threshold voltage, the first rate being greater than the post-threshold rate.

14. The drive circuit of claim 12 wherein:

the drive transistor has a threshold voltage;

the first signal level comprises a voltage level; and the first drive-control stage is operable to generate the voltage level such that during the first time period, the voltage level changes at a pre-threshold rate when the voltage level is less than the threshold voltage and changes at the first rate when the voltage level is equal to or greater than the threshold voltage, the pre-threshold rate being greater than the first rate.

15. The drive circuit of claim 12 wherein the second signal level changes at a second rate that is greater than the first rate.

16. The drive circuit of claim 12 wherein:

the first signal level comprises a first voltage level that increases at the first rate;

the second signal level comprises a second voltage level that increases at a second rate; and the total signal level comprises a total voltage level that increases at the total rate.

17. The drive circuit of claim 12 wherein the first drive-control stage comprises a first inverter having inverter input and output terminals respectively coupled to the input and output terminals of the first drive-control stage, the first inverter including a first transistor having a control terminal coupled to the inverter input terminal, a first transistor terminal coupled to the second supply terminal, and a second transistor terminal coupled to the inverter output terminal, the first transistor having a first gain and the second transistor of the second drive-control stage having a second gain that is greater than the first gain of the first transistor.

18. A drive circuit, comprising:

drive input and output terminals;

a first supply terminal;

a drive transistor having a control terminal, a first transistor terminal coupled to the drive output terminal, and a second transistor terminal coupled to the supply terminal; and a drive-control circuit having first and second inverters, and a second transistor, the first inverter having inverter input and output terminals respectively coupled to the drive input terminal and the control terminal of the drive transistor, the first inverter including a first transistor having a control terminal coupled to the inverter input terminal, a first transistor terminal coupled to the second supply terminal, and a second transistor terminal coupled to the inverter output terminal, the second inverter having an inverter input terminal coupled to the inverter output terminal of the first inverter and having an output terminal, and the second transistor having a control terminal coupled to the inverter output terminal of the second inverter, a first transistor terminal coupled to the second supply terminal, and a second transistor terminal coupled to the control terminal of the drive transistor, the drive-control circuit operable to generate a signal on the control terminal of the drive transistor such that the drive transistor drives a 50-ohm load coupled to the drive output terminal with a resistive drive signal having a resistive slew-rate within a first range of approximately 2.0–5.0 V/nS and such that the drive transistor drives a 50 pf load coupled to the drive output terminal with a capacitive drive signal having a capacitive slew-rate within a second range of approximately 1.3–3.8 V/nS.

19. The drive circuit of claim 18 wherein:

the resistive drive signal has a first linear region and the resistive slew-rate is within the first range when the resistive drive signal is within the first linear region; and the capacitive drive signal has a second linear region and the capacitive slew-rate is within the second range when the capacitive drive signal is within the second linear region.

20. The drive circuit of claim 18 wherein:

the resistive drive signal has the resistive slew-rate when the resistive drive signal is within a voltage range of approximately 1.2–1.8 V; and the capacitive drive signal has the capacitive slew-rate when the capacitive drive signal is within the voltage range.

21. The drive circuit of claim 18 wherein the drive transistor sinks a current within a range of approximately 75.4–202.5 milliamperes when the drive output terminal is at approximately 1.65 V.

22. The drive circuit of claim 18 wherein:

the drive transistor comprises an NMOS transistor; and the resistive and capacitive drive signals comprise respective resistive and capacitive pull-down signals.

23. A drive-control circuit, comprising:

circuit input, output, and supply terminals;

a first inverter having an inverter input terminal coupled to the circuit input terminal and having an inverter output terminal coupled to the circuit output terminal, the first inverter including a first transistor having a control terminal coupled to the inverter input terminal, a first transistor terminal coupled to the supply terminal, and a second transistor terminal coupled to the inverter output terminal, the first transistor having a first gain;

a second inverter having an inverter input terminal coupled to the inverter output terminal of the first inverter and having an inverter output terminal; and a second transistor having a control terminal coupled to the inverter output terminal of the second inverter, a first transistor terminal coupled to the supply terminal, and a second transistor terminal coupled to the circuit output terminal, the second transistor having a second gain that is greater than the first gain of the first transistor.

24. The circuit of claim 23 wherein the first and second transistors comprise respective PMOS transistors.

25. The circuit of claim 23 wherein the second gain is at least twice the first gain.

26. The circuit of claim 23 wherein:

the first transistor comprises a first PMOS transistor having a first channel-width-to-channel-length ratio; and the second transistor comprises a second PMOS transistor having a second channel-width-to-channel-length ratio that is at least twice the first ratio.

27. The circuit of claim 23, further comprising a switch coupled between the first transistor terminal of the second transistor and the supply terminal, the switch having a control terminal coupled to the circuit input terminal, a first switch terminal coupled to the supply terminal, and a second switch terminal coupled to the first transistor terminal of the second transistor.

28. The circuit of claim 23, further comprising a third transistor coupled between the first transistor terminal of the second transistor and the supply terminal, the third transistor having a control terminal coupled to the circuit input terminal, a first transistor terminal coupled to the supply terminal, and a second transistor terminal coupled to the first transistor terminal of the second transistor.

29. A drive circuit, comprising:

a first drive input terminal;

a drive output terminal;

first and second supply terminals;

a first inverter having an inverter input terminal coupled to the drive input terminal and having an inverter output terminal;

a second inverter having an inverter input terminal coupled to the inverter output terminal of the first inverter and having an inverter output terminal;

a first transistor having a control terminal coupled to the inverter output terminal of the second inverter, a first transistor terminal coupled to the first supply terminal, and a second transistor terminal coupled to the inverter output terminal of the first inverter; and a first drive transistor having a control terminal coupled to the inverter output terminal of the first inverter, a first transistor terminal coupled to the drive output terminal, and a second transistor terminal coupled to the second supply terminal.

30. The drive circuit of claim 29 wherein:

the first transistor comprises a PMOS transistor; and the drive transistor comprises an NMOS transistor.

31. The drive circuit of claim 29 wherein:

the first transistor has a first gain; and the first inverter includes a second transistor having a control terminal coupled to the inverter input terminal, a first transistor terminal coupled to the first supply terminal, and a second transistor terminal coupled to the inverter output terminal, the second transistor having a second gain that is one half or less of the first gain.

32. The circuit of claim 29, further comprising a switch coupled between the first transistor terminal of the first transistor and the first supply terminal, the switch having a control terminal coupled to the drive input terminal, a first switch terminal coupled to the first supply terminal, and a second switch terminal coupled to the first transistor terminal of the first transistor.

33. The circuit of claim 29, further comprising:

a second drive input terminal; and a second drive transistor having a control terminal coupled to the second drive input terminal, a first transistor terminal coupled to the first supply terminal, and a second transistor terminal coupled to the drive output terminal.

34. The circuit of claim 29, further comprising:

a second drive input terminal;

a second drive transistor having a control terminal, a first transistor terminal coupled to the first supply terminal, and a second transistor terminal coupled to the drive output terminal;

a voltage boost circuit having an input terminal coupled to the second drive input terminal and having an output terminal coupled to the control terminal of the second drive transistor; and wherein the first and second drive transistors comprise respective NMOS transistors.

35. A memory circuit, comprising:

a supply terminal;

address, data, and command busses;

a data terminal coupled to the data bus;

a bank of memory cells;

an address decoder coupled to the address bus and to the memory bank;

a control circuit coupled to the command bus and to the address decoder;

a read/write circuit coupled to the address decoder, control circuit, and memory bank, the read/write circuit operable to generate a data signal during a read cycle; and a data input/output circuit coupled to the data bus, read/write circuit, and control circuit, the data input/output circuit including a data output driver that includes, a drive input terminal coupled to the read/write circuit, a drive output terminal coupled to the data terminal, a drive transistor having a control terminal, a first transistor terminal coupled to the drive output terminal, and a second transistor terminal coupled to the supply terminal, and a drive-control circuit having first and second inverters, and a second transistor, the first inverter having inverter input and output terminals respectively coupled to the drive input terminal and the control terminal of the drive transistor, the first inverter including a first transistor having a control terminal coupled to the inverter input terminal, a first transistor terminal coupled to the second supply terminal, and a second transistor terminal coupled to the inverter output terminal, the second inverter having an inverter input terminal coupled to the inverter output terminal of the first inverter and having an output terminal, and the second transistor having a control terminal coupled to the inverter output terminal of the second inverter, a first transistor terminal coupled to the second supply terminal, and a second transistor terminal coupled to the control terminal of the drive transistor, the drive-control circuit operable to generate a signal level on the control terminal of the drive transistor in response to the data signal, the signal level changing at a first rate during a first time period and changing at a second rate during a second time period following the first time period, the second rate being greater than the first rate.

36. A memory circuit, comprising:

first and second supply terminals;

address, data, and command busses;

a data terminal coupled to the data bus;

a bank of memory cells;

an address decoder coupled to the address bus and to the memory bank;

a control circuit coupled to the command bus and to the address decoder;

a read/write circuit coupled to the address decoder, control circuit, and memory bank, the read/write circuit operable to generate a data signal during a read cycle; and a data input/output circuit coupled to the data bus, read/write circuit, and control circuit, the data input/output circuit including a data output driver that includes, a drive input terminal coupled to the read/write circuit, a drive output terminal coupled to the data terminal, a drive transistor having a control terminal, a first transistor terminal coupled to the drive output terminal, and a second transistor terminal coupled to the supply terminal, a first drive-control stage having an input terminal coupled to the drive input terminal and having an output terminal coupled to the control terminal of the drive transistor, the first drive-control stage operable to cause a signal level on the control terminal of the drive transistor to change at a first rate in response to the data signal, and a second drive-control stage having an activation level and a second inverter having an inverter input terminal coupled to the output terminal of the first drive-control stage and having an output terminal, the second drive-control stage further having a second transistor having a control terminal coupled to the inverter output terminal of the second inverter, a first transistor terminal coupled to the second supply terminal, and a second transistor terminal coupled to the control terminal of the drive transistor, the second stage operable to cause the signal level to change at a second rate that is greater than the first rate when the signal level is equal to or greater than the activation level.

37. A memory circuit, comprising:

a supply terminal;

address, data, and command busses;

a data terminal coupled to the data bus;

a bank of memory cells;

an address decoder coupled to the address bus and to the memory bank;

a control circuit coupled to the command bus and to the address decoder;

a read/write circuit coupled to the address decoder, control circuit, and memory bank, the read/write circuit operable to generate a data signal during a read cycle; and a data input/output circuit coupled to the data bus, read/write circuit, and control circuit, the data input/output circuit including a data output driver that includes, a drive input terminal coupled to the read/write circuit, a drive output terminal coupled to the data terminal, a drive transistor having a control terminal, a first transistor terminal coupled to the drive output terminal, and a second transistor terminal coupled to the supply terminal; and a drive-control circuit having first and second inverters, and a second transistor, the first inverter having inverter input and output terminals respectively coupled to the drive input terminal and the control terminal of the drive transistor, the first inverter including a first transistor having a control terminal coupled to the inverter input terminal, a first transistor terminal coupled to the second supply terminal, and a second transistor terminal coupled to the inverter output terminal, the second inverter having an inverter input terminal coupled to the inverter output terminal of the first inverter and having an output terminal, and the second transistor having a control terminal coupled to the inverter output terminal of the second inverter, a first transistor terminal coupled to the second supply terminal, and a second transistor terminal coupled to the control terminal of the drive transistor, the drive-control circuit operable to generate a signal on the control terminal of the drive transistor in response to the data signal such that the drive transistor drives a 50-ohm load coupled to the drive output terminal with a resistive drive signal having a resistive slew-rate within a first range of approximately 2.0–5.0 V/nS and such that the drive transistor drives a 50 pf load coupled to the drive output terminal with a capacitive drive signal having a capacitive slew-rate within a second range of approximately 1.3–3.8 V/nS.

38. An electronic system, comprising:
a data input device;
a data output device; and
computing circuitry coupled to said data input and output devices, said computing circuitry including a memory circuit that includes:
a supply terminal,
address, data, and command busses,
a data terminal coupled to the data bus,
a bank of memory cells,
an address decoder coupled to the address bus and to the memory bank,
a control circuit coupled to the command bus and to the address decoder,
a read/write circuit coupled to the address decoder, control circuit, and memory bank, the read/write circuit operable to generate a data signal during a read cycle, and
a data input/output circuit coupled to the data bus, read/write circuit, and control circuit, the data input/output circuit including a data output driver that includes,
a drive input terminal coupled to the read/write circuit,
a drive output terminal coupled to the data terminal,
a drive transistor having a control terminal, a first transistor terminal coupled to the drive output terminal, and a second transistor terminal coupled to the supply terminal, and
a drive-control circuit having first and second inverters, and a second transistor, the first inverter having inverter input and output terminals respectively coupled to the drive input terminal and the control terminal of the drive transistor, the first inverter including a first transistor having a control terminal coupled to the inverter input terminal, a first transistor terminal coupled to the second supply terminal, and a second transistor terminal coupled to the inverter output terminal, the second inverter having an inverter input terminal coupled to the inverter output terminal of the first inverter and having an output terminal, and the second transistor having a control terminal coupled to the inverter output terminal of the second inverter, a first transistor terminal coupled to the second supply terminal, and a second transistor terminal coupled to the control terminal of the drive transistor, the drive-control circuit operable to generate a signal level on the control terminal of the drive transistor in response to the data signal, the signal level changing at a first rate during a first time period and changing at a second rate during a second time period following the first time period, the second rate being greater than the first rate.

39. An electronic system, comprising:
a data input device;
a data output device; and
computing circuitry coupled to said data input and output devices, said computing circuitry including a memory circuit that includes,
first and second supply terminals,
address, data, and command busses,
a data terminal coupled to the data bus,
a bank of memory cells;
an address decoder coupled to the address bus and to the memory bank,
a control circuit coupled to the command bus and to the address decoder,
a read/write circuit coupled to the address decoder, control circuit, and memory bank, the read/write circuit operable to generate a data signal during a read cycle, and
a data input/output circuit coupled to the data bus, read/write circuit, and control circuit, the data input/output circuit including a data output driver that includes,
a drive input terminal coupled to the read/write circuit,
a drive output terminal coupled to the data terminal,
a drive transistor having a control terminal, a first transistor terminal coupled to the drive output terminal, and a second transistor terminal coupled to the supply terminal,
a first drive-control stage having an input terminal coupled to the drive input terminal and having an output terminal coupled to the control terminal of the drive transistor, the first drive-control stage operable to cause a signal level on the control terminal of the drive transistor to change at a first rate in response to the data signal, and
a second drive-control stage having an activation level and a second inverter having an inverter input terminal coupled to the output terminal of the first drive-control stage and having an output terminal, the second drive-control stage further having a second transistor having a control terminal coupled to the inverter output terminal of the second inverter, a first transistor terminal coupled to the second supply terminal, and a second transistor terminal coupled to the control terminal of the drive transistor, the second drive-control stage operable to cause the signal level to change at a second rate that is greater than the first rate when the signal level is equal to or greater than the activation level.

40. An electronic system, comprising:
a data input device,
a data output device, and
computing circuitry coupled to said data input and output devices, said computing circuitry including a memory circuit that includes, a supply terminal, address, data, and command busses, a data terminal coupled to the data bus, a bank of memory cells, an address decoder coupled to the address bus and to the memory bank, a control circuit coupled to the command bus and to the address decoder, a read/write circuit coupled to the address decoder, control circuit, and memory bank, the read/write circuit operable to generate a data signal during a read cycle, and a data input/output circuit coupled to the data bus, read/write circuit, and control circuit, the data input/output circuit including a data output driver that includes, a drive input terminal coupled to the read/write circuit, a drive output terminal coupled to the data terminal, a drive transistor having a control terminal, a first transistor terminal coupled to the drive output terminal, and a second transistor terminal coupled to the supply terminal; and a drive-control circuit having first and second inverters, and a second transistor, the first inverter having inverter input and output terminals respectively coupled to the drive input terminal and the control terminal of the drive transistor, the first inverter including a first transistor having a control terminal coupled to the inverter input terminal, a first transistor terminal coupled to the second supply terminal, and a second transistor terminal coupled to the inverter output terminal, the second inverter having an inverter input terminal coupled to the inverter output terminal of the first inverter and having an output terminal, and the second transistor having a control terminal coupled to the inverter output terminal of the second inverter, a first transistor terminal coupled to the second supply terminal, and a second transistor terminal coupled to the control terminal of the drive transistor, the drive-control circuit operable to generate a signal on the control terminal of the drive transistor in response to the data signal such that the drive transistor drives a 50-ohm load coupled to the drive output terminal with a resistive drive signal having a resistive slew-rate within a first range of approximately 2.0–5.0 V/nS and such that the drive transistor drives a 50 pf load coupled to the drive output terminal with a capacitive drive signal having a capacitive slew-rate within a second range of approximately 1.3–3.8 V/nS.

41. A method of driving a transistor, comprising:

driving a drive transistor with a signal having a first slope, the signal having the first slope generated by a first drive-control stage, the first-drive control stage having an input coupled to a drive input terminal and having an output coupled to a control terminal of the drive transistor; and after driving the drive transistor with the signal having the first slope, driving the drive transistor with the signal having a second slope greater than the first slope, the signal having the second slope generated by activating a second drive-control stage having a second inverter having an inverter input coupled to the output of the first drive-control stage and having an output, the second drive-control stage further having a second transistor having a control terminal coupled to the inverter output of the second inverter and a first transistor terminal coupled to a supply terminal, and a second transistor terminal coupled to the control terminal of the drive transistor.

42. The method of claim 41 wherein the driving the drive transistor with the signal having the second slope comprises causing the signal to have the second slope when the signal is equal to or greater than a predetermined signal level.

43. The method of claim 41 wherein the driving a drive transistor with the signal having a first slope comprises driving the drive transistor with a voltage signal having the first slope when the voltage signal is less than a threshold voltage of the drive transistor and driving the drive transistor with the voltage signal having a post-threshold slope when the voltage signal is equal to or greater than the threshold voltage, the first slope being greater than the post-threshold slope.

44. The method of claim 41 wherein the driving a drive transistor with the signal having the first slope comprises driving the drive transistor with a voltage signal having a pre-threshold slope when the voltage signal is less than a threshold voltage of the drive transistor and driving the drive transistor with the voltage signal having the first slope when the voltage signal is equal to or greater than the threshold voltage, the pre-threshold slope being greater than the first slope.

45. The method of claim 41 wherein the first and second slopes are positive.

46. A method of driving capacitive or resistive loads, comprising generating a signal that causes a drive transistor to drive a 50-ohm load with a resistive drive signal having a resistive slew-rate within a first range of approximately 2.0–5.0 V/nS and that causes the drive transistor to drive a 50 pf load with a capacitive drive signal having a capacitive slew-rate within a second range of approximately 1.3–3.8 V/nS, the signal generated by a drive circuit having first and second inverters, and a second transistor, the first inverter having inverter input and output terminals respectively coupled to the drive input terminal and the control terminal of the drive transistor, the first inverter including a first transistor having a control terminal coupled to the inverter input terminal, a first transistor terminal coupled to the second supply terminal, and a second transistor terminal coupled to the inverter output terminal, the second inverter having an inverter input terminal coupled to the inverter output terminal of the first inverter and having an output terminal, and the second transistor having a control terminal coupled to the inverter output terminal of the second inverter, a first transistor terminal coupled to the second supply terminal, and a second transistor terminal coupled to the control terminal of the drive transistor.

47. The method of claim 46, further comprising:

generating the signal such that the drive transistor generates the resistive drive signal having a first linear region and such that the resistive slew-rate is within the first range when the resistive drive signal is within the first linear region; and generating the signal such that the drive transistor generates the capacitive drive signal having a second linear region and such that the capacitive slew-rate is within the second range when the capacitive drive signal is within the second linear region.

48. The method of claim 46, further comprising generating the signal such that the drive transistor generates the resistive drive signal having the resistive slew-rate and the capacitive drive signal having the capacitive slew-rate when the resistive and capacitive drive signals are respectively within a voltage range of approximately 1.2–1.8 V.

49. The method of claim 46, further comprising generating the signal such that the drive transistor sinks respective drive currents within a range of approximately 75.4–202.5 milliamperes when the resistive and capacitive drive signals are at approximately 1.65 V.

* * * * *

UNITED STATES PATENT AND TRADEMARK OFFICE
CERTIFICATE OF CORRECTION

PATENT NO.    : 6,072,729
DATED         : June 6, 2000
INVENTOR(S)   : Stephen L. Casper It is certified that error appears in the above-identified patent and that said Letters Patent is hereby corrected as shown below:

<u>Title page, item [54],</u>
Title, "DATA-OUTPUT DRIVER CIRCUIT AND METHOD" should read
-- IMPROVED DATA-OUTPUT DRIVER CIRCUIT AND METHOD --

Signed and Sealed this

Sixteenth Day of October, 2001

Attest:

*Nicholas P. Godici*

NICHOLAS P. GODICI
*Attesting Officer*    *Acting Director of the United States Patent and Trademark Office*